(12) United States Patent
Chae et al.

(10) Patent No.: US 12,394,627 B2
(45) Date of Patent: Aug. 19, 2025

(54) SUBSTRATE POLISHING SYSTEM

(71) Applicant: KCTECH CO., LTD., Gyeonggi-do (KR)

(72) Inventors: Hee Sung Chae, Gyeonggi-do (KR); Seung Eun Lee, Seoul (KR); Geun Sik Yun, Gyeonggi-do (KR)

(73) Assignee: KCTech Co., Ltd., Anseong-si (KR)

( * ) Notice: Subject to any disclaimer, the term of this patent is extended or adjusted under 35 U.S.C. 154(b) by 270 days.

(21) Appl. No.: 17/575,913

(22) Filed: Jan. 14, 2022

(65) Prior Publication Data

US 2022/0277963 A1  Sep. 1, 2022

(30) Foreign Application Priority Data

Feb. 26, 2021 (KR) .................. 10-2021-0026892

(51) Int. Cl.
| | |
|---|---|
| *H01L 21/306* | (2006.01) |
| *H01L 21/67* | (2006.01) |
| *H01L 21/673* | (2006.01) |
| *H01L 21/677* | (2006.01) |
| *H01L 21/687* | (2006.01) |

(52) U.S. Cl.
CPC .. *H01L 21/30625* (2013.01); *H01L 21/67219* (2013.01); *H01L 21/6732* (2013.01); *H01L 21/67766* (2013.01); *H01L 21/68764* (2013.01); *H01L 21/68792* (2013.01)

(58) Field of Classification Search
CPC ......... H01L 21/30625; H01L 21/67219; H01L 21/6732; H01L 21/67766; H01L 21/68764; H01L 21/68792; H01L 21/67092; H01L 21/67742; H01L 21/67745; B24B 37/30; B24B 37/345; B24B 37/10; B24B 27/0076
See application file for complete search history.

(56) References Cited

U.S. PATENT DOCUMENTS

| | | | | |
|---|---|---|---|---|
| 5,655,954 | A  * | 8/1997 | Oishi | H01L 21/67028 |
| | | | | 451/287 |
| 6,358,128 | B1 * | 3/2002 | Sakurai | B24B 37/345 |
| | | | | 451/287 |
| 6,629,883 | B2 * | 10/2003 | Katsuoka | H01L 21/67745 |
| | | | | 451/41 |
| 9,054,146 | B2 * | 6/2015 | Wi | H01L 21/68707 |
| 2004/0216842 | A1 * | 11/2004 | Jeong | B24B 37/042 |
| | | | | 156/345.11 |
| 2005/0111936 | A1 * | 5/2005 | Kim | H01L 21/67745 |
| | | | | 414/217 |
| 2005/0282472 | A1 | 12/2005 | Jeong | |

(Continued)

FOREIGN PATENT DOCUMENTS

| | | | |
|---|---|---|---|
| JP | 2000124290 | A | 4/2000 |
| JP | 2002510875 | A | 4/2002 |
| JP | 2005131772 | A | 5/2005 |

*Primary Examiner* — Joshua L Allen
*Assistant Examiner* — Christopher Remavege
(74) *Attorney, Agent, or Firm* — KDW Firm PLLC

(57) ABSTRACT

A substrate polishing system may include a substrate transfer unit comprising a shaft to rotate on a rotation axis perpendicular to a ground and at least one transfer arm to support a bottom surface of a substrate and transfer the substrate while forming a transfer orbit by rotation of the shaft, and at least one carrier to perform polishing the substrate transferred by the substrate transfer unit.

17 Claims, 5 Drawing Sheets

(56) References Cited

U.S. PATENT DOCUMENTS

2011/0104997 A1* 5/2011 Jeong ................ H01L 21/67219
 451/65
2015/0105005 A1* 4/2015 Zuniga .................... B24B 37/10
 451/259
2021/0323118 A1* 10/2021 Rangarajan ....... H01L 21/67219

* cited by examiner

SUBSTRATE POLISHING SYSTEM

CROSS-REFERENCE TO RELATED APPLICATION

This application claims the benefit of Korean Patent Application No. 10-2021-0026892 filed on Feb. 26, 2021, in the Korean Intellectual Property Office, the entire disclosure of which is incorporated herein by reference for all purposes.

BACKGROUND

1. Field of the Invention

One or more example embodiments relate to a substrate polishing system.

2. Description of the Related Art

In the process of manufacturing a semiconductor device, a chemical mechanical polishing or planarization (CMP) process including polishing, buffing, and cleaning is required. The semiconductor device may be configured to have a multilayer structure wherein a transistor device with a diffusion region is provided at a substrate layer. In the substrate layer, a connecting metallic line may be patterned and electrically connected to the transistor device that constitutes a functional device. A patterned conductive layer may be insulated from other conductive layers by an insulator such as silicon dioxide. As more metal layers and corresponding insulating layers are formed, a need to flatten insulators may increase. Without flattening, manufacturing an additional metal layer may be more difficult due to numerous irregularities in a surface. In addition, the metallic line pattern may be formed of an insulator and a metal CMP process may be performed to remove excess metal.

To increase the production efficiency of the CMP process, reducing a waiting time between processes or transfers and performing the processes or transfers in parallel are required. For example, a production efficiency of the CMP process may be improved by reducing a substrate transfer path and simultaneously performing transferring and polishing on a plurality of substrates.

The above description is information the inventor(s) acquired during the course of conceiving the present disclosure, or already possessed at the time, and is not necessarily art publicly known before the present application was filed.

SUMMARY

Example embodiments provide a substrate polishing system that may simultaneously perform transferring and polishing on a plurality of substrates in parallel.

Example embodiments also provide a substrate polishing system that may reduce a substrate transfer path and enhance a transfer efficiency.

According to an aspect, there is provided a substrate polishing system including a substrate transfer unit may include a shaft to rotate on a rotation axis perpendicular to a ground and at least one transfer arm to support a bottom surface of a substrate, and transfer the substrate while forming a transfer orbit by rotation of the shaft, and at least one carrier to perform polishing the substrate transferred by the substrate transfer unit.

The transfer arm may receive an unpolished substrate at a first transfer point on the transfer orbit and transfer the unpolished substrate to the carrier at a second transfer point on the transfer orbit.

The transfer arm may receive a polished substrate from the carrier at the second transfer point and transfer the polished substrate to a next process at the first transfer point.

The substrate polishing system may further include a loader disposed at the second transfer point wherein the loader loads the substrate from the transfer arm to the carrier or unloads the substrate from the carrier to the transfer arm.

In a process of loading or unloading by the loader, the substrate transfer unit may be vertically movable.

The loader may be integrally formed with the substrate transfer unit.

A plurality of transfer arms may be provided and be each disposed at a predetermined interval with the shaft as center.

When one of the plurality of transfer arms is placed on the first transfer point, at least one of the plurality of transfer arms may be placed on the second transfer point.

The substrate polishing system may further include a carrier transfer unit to support the carrier from an upper side and transfer the carrier while forming a carrier orbit in a circle by rotating on a rotation axis perpendicular to a ground.

The carrier may receive an unpolished substrate from the transfer arm at a first carrier point on the carrier orbit and perform polishing on the unpolished substrate at a second carrier point on the carrier orbit.

The carrier may transfer a polished substrate from the first carrier point to the transfer arm placed on the second transfer point.

The first carrier point may overlap with the second transfer point.

The second carrier point may overlap with a platen on which a polishing pad is placed.

A plurality of carriers may be provided and be each disposed at a predetermined interval with the rotation axis of the carrier transfer unit as a center.

When one of the plurality of carriers is placed on the first carrier point, at least one of the plurality of carriers may be placed on the second carrier point.

Additional aspects of example embodiments will be set forth in part in the description which follows and, in part, will be apparent from the description, or may be learned by practice of the disclosure.

According to example embodiments, a substrate polishing system may perform polishing on a plurality of substrates, in succession and in parallel, thereby improving production efficiency.

According to example embodiments, a substrate polishing system may perform loading and/or unloading of a second substrate while polishing a first substrate, thereby improving production efficiency.

According to example embodiments, a substrate polishing system may reduce a substrate transfer path and increase transfer efficiency.

The effects of the substrate polishing system are not limited to the above-mentioned effects, and other unmentioned effects can be clearly understood from the above description by those having ordinary skill in the technical field to which the present disclosure pertains.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
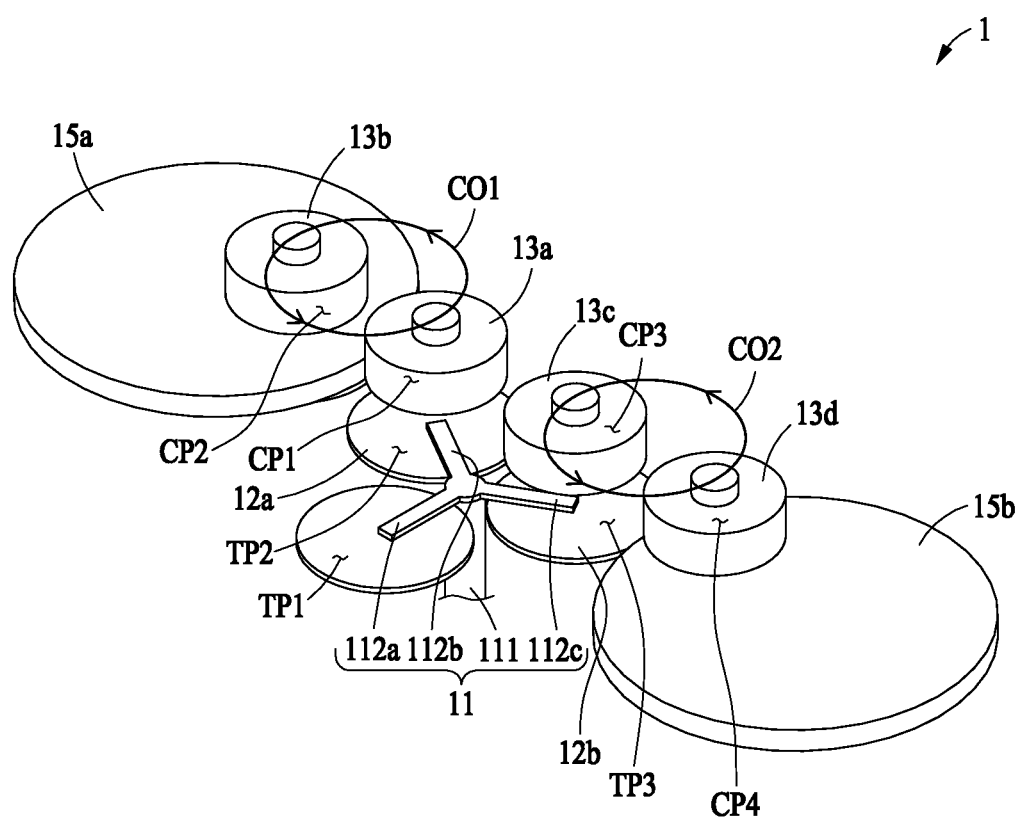
FIG. 1 is a schematic perspective view of a substrate polishing system according to an example embodiment.

Hereinafter, example embodiments will be described in detail with reference to the accompanying drawings. However, various alterations and modifications may be made to the example embodiments. Here, the example embodiments are not construed as limited to the disclosure. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the example embodiments described above and an element having a common function. Unless otherwise mentioned, the descriptions on the example embodiments may be applicable to the following example embodiments and thus, duplicated descriptions will be omitted for conciseness.

Figure 2:
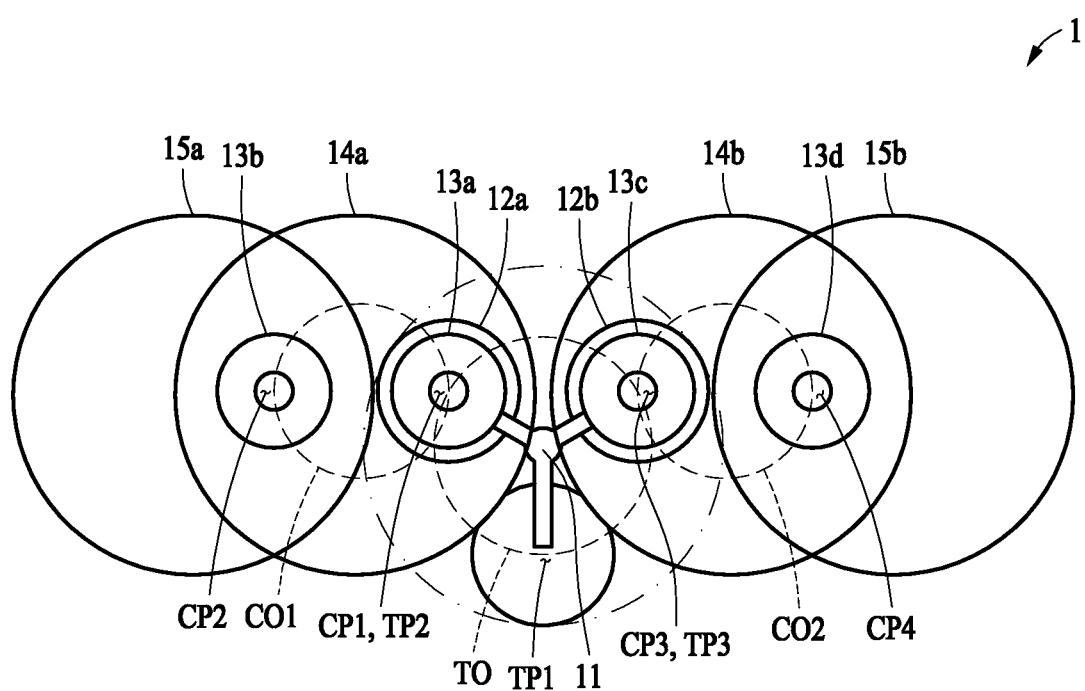
FIG. 2 is a schematic plan view of a substrate polishing system according to an example embodiment.

FIG. 1 is a schematic perspective view of a substrate polishing system according to an example embodiment. FIG. 2 is a schematic plan view of a substrate polishing system according to an example embodiment and FIG. 3 is a schematic side view of a substrate polishing system according to an example embodiment.

Figure 3:
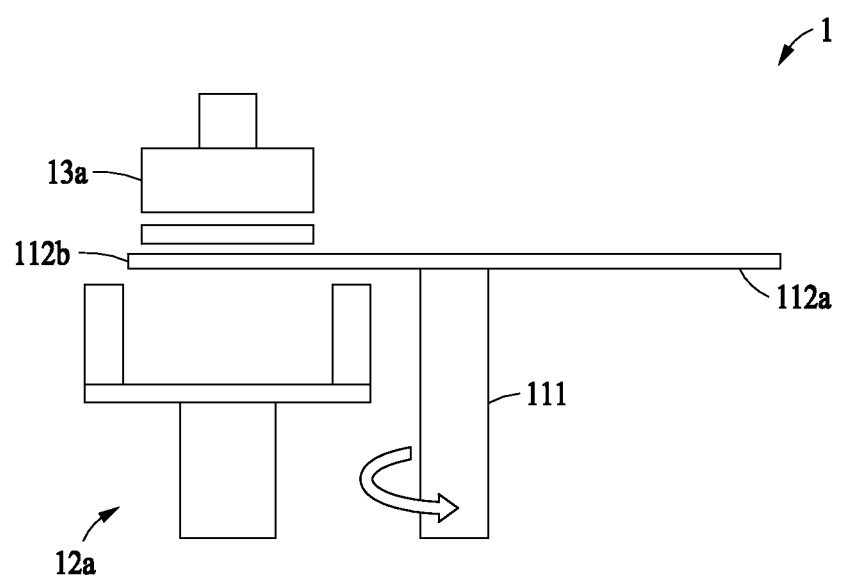
FIG. 3 is a schematic side view of a substrate polishing system according to an example embodiment.

Referring to FIGS. 1 to 3, a substrate polishing system 1 may be used in a chemical mechanical polishing or planarization (CMP) process to polish a surface of a substrate. A substrate polished by the substrate polishing system 1 may be a silicon wafer for manufacturing a semiconductor device. However, the type of the substrate is not limited to the foregoing example. The substrate may include, for example, glass for a liquid crystal display (LCD), a plasma display panel (PDP), and a flat panel display (FPD). Although the drawings illustrate a substrate in a circular form, the example is only for ease of description and the form of the substrate is not limited to the one illustrated in the drawings.

The substrate polishing system 1 may include a substrate transfer unit 11, a loader 12, a carrier 13, a carrier transfer unit 14, and a platen 15.

The substrate transfer unit 11 may receive an unpolished substrate from a cassette (or a process prior to polishing) through a return unit. The substrate transfer unit 11 may transfer the received substrate to the carrier 13. In addition, the substrate transfer unit 11 may receive a polished substrate from the carrier 13 and may transfer the polished substrate for a process performed after polishing (for example, a cleaning process). The substrate transfer unit 11 may transfer a substrate along a circular orbit. The substrate transfer unit 11 may simultaneously transfer a plurality of substrates. For example, a transfer of an unpolished substrate and a transfer of a polished substrate may be performed simultaneously.

The substrate transfer unit 11 may include a shaft 111 and a transfer arm 112.

The shaft 111 may rotate on a rotation axis perpendicular to a ground. The shaft 111 may rotate in one direction or in two directions. The transfer arm 112 may be connected to the shaft 111 and may integrally rotate with the shaft 111. The transfer arm 112 may support a bottom surface of a substrate. For example, one end of the transfer arm 112 may be connected to the shaft 111, and another end may support a bottom surface of a substrate. However, the transfer arm 112 of FIG. 1 is schematically illustrated and a structure that may stably support a substrate may be provided at another end of the transfer arm 112.

The transfer arm 112 may rotate on the shaft 111 while forming a transfer orbit TO by rotation of the shaft 111. The transfer orbit TO may be circular. The transfer arm 112 may transfer a substrate to one point on the transfer orbit TO by rotating on the shaft 111 while the substrate is placed on an end portion.

At least one transfer arm 112 may be provided. For example, a plurality of transfer arms 112 may be provided. For example, the transfer arms 112 may include a first transfer arm 112*a*, a second transfer arm 112*b*, and a third transfer arm 112*c*. The plurality of transfer arms 112 may each be disposed at a predetermined interval with the shaft 111 as a center. For example, the plurality of transfer arms 112 may each be disposed at an equiangular interval with the shaft 111 as a center. However, the number of transfer arms 112 of FIGS. 1 and 2 is an example, and there may be one, two, three, four, or more transfer arms 112. A more detailed description of a transfer of a substrate by the transfer arms 112 is described below.

The loader 12 may load an unpolished substrate from the transfer arm 112 to the carrier 13. The loader 12 may unload a polished substrate from the carrier 13 to the transfer arm 112. The loader 12 may load or unload a substrate through moving vertically. In a process of loading or unloading a substrate by the loader 12, the substrate transfer unit 11 (for example, the transfer arm 112) may be moved in a vertical direction. A plurality of loaders 12 may be provided. For example, a number of loaders 12 may correspond to a number of platens 15. For example, as shown in FIGS. 1 and 2, when the platen 15 includes a first platen 15a and a second platen 15b, the loader 12 may include a first loader 12a and a second loader 12b. Meanwhile, the loader 12 may be integrally formed with the substrate transfer unit 11. That is, the substrate transfer unit 11 (for example, the transfer arm 112) may load or unload a substrate onto the carrier 13 by itself through moving vertically without a loader.

The carrier 13 may grip a substrate and may perform polishing on the substrate through rotation. The carrier 13 may grip a substrate from an upper side. For example, the carrier 13 may grip a substrate by adsorption through a membrane (not shown). A polishing pad (not shown) may be seated on an upper surface of the platen 15 and the platen 15 may rotate the polishing pad. The carrier 13 may perform polishing by placing the polishing pad placed on the platen 15 in frictional contact with a polishing surface of the substrate. The carrier 13 and the platen 15 may polish the substrate by the polishing pad through at least a relative rotational motion. For example, the carrier 13 may rotate and/or translate (oscillate) for polishing a substrate. Meanwhile, the carrier 13 may move in a vertical direction for loading/unloading a substrate or polishing the substrate.

At least one carrier 13 may be provided for one platen 15. In addition, at least one platen 15 may be provided. For example, as shown in FIGS. 1 and 2, the carrier 13 may include a first carrier 13a, a second carrier 13b, a third carrier 13c, and a fourth carrier 13d and the platen 15 may include a first platen 15a and a second platen 15b. For example, as shown in FIGS. 1 and 2, the first carrier 13a and the second carrier 13b may operate as a set for the first platen 15a, and the third carrier 13c and the fourth carrier 13d may operate as a set for the second platen 15b. However, FIGS. 1 and 2 show examples and there may be any number of platens 15 and any number of carriers 13. In addition, any number of a plurality of carriers 13 may operate in a set for one platen 15.

The carrier transfer unit 14 may support the carrier 13 from an upper side and may move the carrier 13. For example, the carrier transfer unit 14 form a carrier orbit CO while rotating on an axis perpendicular to the ground and may move the carrier 13. The carrier orbit CO may be circular. A plurality of carrier transfer units 14 may be provided. For example, a number of the carrier transfer units 14 may correspond to a number of the platens 15. For example, the carrier transfer unit 14 may include a first carrier transfer unit 14a and a second carrier transfer unit 14b. A plurality of carriers 13 may be connected to one carrier transfer unit 14. For example, the first carrier transfer unit 14a may be connected to the first carrier 13a and the second carrier 13b, and the first carrier 13a and the second carrier 13b may move along a first carrier orbit CO1. The second carrier transfer unit 14b may be connected to the third carrier 13c and the fourth carrier 13d and the third carrier 13c and the fourth carrier 13d may move along a second carrier orbit CO2. However, a number of carriers 13 connected to one carrier transfer unit 14 is not limited to the foregoing examples. When a plurality of carriers 13 is connected to one carrier transfer unit 14, the plurality of carriers 13 may each be disposed at a predetermined interval with a rotation axis of the carrier transfer unit 14 as a center. For example, the plurality of carriers 13 may each be disposed at an equiangular interval with a rotation axis of the carrier transfer unit 14 as a center.

Hereinafter, the transfer orbit TO of the substrate transfer unit 11 is described with reference to FIGS. 1 and 2.

The transfer arm 112 may rotate along the transfer orbit TO and may be placed on at least one of a first transfer point TP1, a second transfer point TP2, and a third transfer point TP3.

The transfer arm 112 may receive an unpolished substrate at the first transfer point TP1 on the transfer orbit TO. For example, the transfer arm 112 may receive an unpolished substrate from a cassette (or after a process prior to polishing) through a return unit (not shown). The received substrate may be seated on the transfer arm 112 placed on the first transfer point TP1. In addition, the transfer arm 112 may transfer a polished substrate at the first transfer point TP1 for a next process. For example, the transfer arm 112 may transfer a polished substrate for a next process (for example, a cleaning process) through the return unit at the first transfer point TP1. That is, the first transfer point TP1 may function as a stage on which a substrate waiting for transfer is seated.

The transfer arm 112 may transfer an unpolished substrate to the carrier 13 at the second transfer point TP2 on the transfer orbit TO. In addition, the carrier 13 (for example, the first carrier 13a or the second carrier 13b) may receive an unpolished substrate from the transfer arm 112 at the first carrier point CP1 on the first carrier orbit CO1. That is, the second transfer point TP2 and the first carrier point CP1 may overlap with each other. The first loader 12a may perform a transfer of a substrate between the transfer arm 112 and the carrier 13. The first loader 12a may be placed on the second transfer point TP2. The first loader 12a may load an unpolished substrate from the transfer arm 112 placed on the second transfer point TP2 to the carrier 13 placed on the first carrier point CP1. The first loader 12a may unload a polished substrate from the carrier 13 placed on the first carrier point CP1 to the transfer arm 112 placed on the second transfer point TP2.

Similarly, the transfer arm 112 may transfer an unpolished substrate to the carrier 13 at the third transfer point TP3 on the transfer orbit TO. In addition, the carrier 13 (for example, the third carrier 13c or the fourth carrier 13d) may receive an unpolished substrate from the transfer arm 112 at the third carrier point CP3 on the second carrier orbit CO2. That is, the third transfer point TP3 and the third carrier point CP3 may overlap with each other. The second loader 12b may perform a transfer of a substrate between the transfer arm 112 and the carrier 13. The second loader 12b may be placed on the third transfer point TP3. The second loader 12b may load an unpolished substrate to the carrier 13 placed on the third carrier point CP3 from the transfer arm 112 placed on the third transfer point TP3. The second loader 12b may unload a polished substrate from the carrier 13 placed on the third carrier point CP3 to the transfer arm 112 placed on the third transfer point TP3.

When one of the plurality of transfer arms 112 is placed on the first transfer point TP1, at least another one of the plurality of transfer arms 112 may be placed on the second transfer point TP2. For example, when the first transfer arm 112a is placed on the first transfer point TP1, the second transfer arm 112b may be placed on the second transfer point TP2. Referring to FIGS. 1 and 2, when the first transfer arm 112a is placed on the first transfer point TP1, the second transfer arm 112b may be placed on the second transfer point TP2, and the third transfer arm 112c may be placed on the third transfer point TP3. By rotation of the shaft 111, the transfer arms 112a, 112b, and 112c may be sequentially placed on the transfer points TP1, TP2, and TP3 respectively.

However, a position and a moving order of the transfer arm 112 are not limited to the foregoing examples. For example, the transfer arm 112 may be transferred from the first transfer point TP1 to the second transfer point TP2, may be directly transferred from the first transfer point TP1 to the third transfer point TP3 passing by the second transfer point TP2, and may be transferred from the first transfer point TP1 to the third transfer point TP3 by rotating in reverse. In addition, the transfer arm 112 may be placed on various points such as a point between the first transfer point TP1 and the second transfer point TP2.

Hereinafter, the carrier orbit CO of the carrier 13 is described with reference to FIGS. 1 and 2. The following description refers to the first carrier 13a, the second carrier 13b, the first carrier transfer unit 14a and the first platen 15a. A description of the third carrier 13c, the fourth carrier 13d, the second carrier transfer unit 14b and the second platen 15b would be substantially the same as the following description. Thus, only the following description is used, to avoid excessive repetition.

The first carrier 13a and the second carrier 13b may be rotated along the first carrier orbit CO1 by rotation of the first carrier transfer unit 14a and may be placed on the first carrier point CP1 and the second carrier point CP2 sequentially. For example, when one of the plurality of carriers 13 is placed on the first carrier point CP1, another one of the plurality of carriers 13 may be placed on the second carrier point CP2. For example, when the first carrier 13a is placed on the first carrier point CP1, the second carrier 13b may be placed on the second carrier point CP2.

The first carrier 13a or the second carrier 13b may receive (load) an unpolished substrate from the substrate transfer unit 11 at the first carrier point CP1 on the first carrier orbit CO1. When the substrate is loaded, the first carrier 13a or the second carrier 13b may move to the second carrier point CP2 on the first carrier orbit CO1 by rotation of the first carrier transfer unit 14a. The first carrier 13a or the second carrier 13b may perform polishing on the unpolished substrate at the second carrier point CP2 on the first carrier orbit CO1. That is, the second carrier point CP2 may overlap with the first platen 15a. When the substrate is polished, the first carrier 13a or the second carrier 13b may move back to the first carrier point CP1 by rotation of the first carrier transfer unit 14a. The first carrier 13a or the second carrier 13b may transfer (unload) the polished substrate to the substrate transfer unit 11 from the first carrier point CP1.

For example, primary polishing may be performed at the first platen 15a and secondary polishing may be performed at the second platen 15b. In this case, when a substrate on which the primary polishing is performed at the first platen 15a is unloaded from the first carrier point CP1 to the transfer arm 112 that is placed on the second transfer point TP2, the transfer arm 112 may be moved to the third transfer point TP3 by rotation of the shaft. The substrate on which the primary polishing is done may be loaded to the carrier 13 placed on the third carrier point CP3 from the third transfer point TP3, and the carrier 13 may be moved to the fourth carrier point CP4 by rotation of the second carrier transfer unit 14b and may perform secondary polishing.

For example, a substrate transferred to the first transfer point TP1 may be transferred to the second transfer point TP2, and then, may be gripped by the carrier 13 placed on the first carrier point CP1, and may be polished by the first platen 15a at the second carrier point CP2. The substrate polished by the first platen 15a may be returned to the first carrier point CP1, may be seated on the transfer arm 112 placed on the second transfer point TP2, may be moved to the third transfer point TP3 and may be gripped by the carrier 13 placed on the third carrier point CP3, and may be polished by the second platen 15b at the fourth carrier point CP4. The substrate polished at the second platen 15b may be returned to the third carrier point CP3, may be seated on the transfer arm 112 placed on the third transfer point TP3, and may be moved to the first transfer point TP and may be transferred for a next process.

As described above, when the carrier transfer unit 14 transfers a carrier and/or a substrate in a rotational way, transferring (for example, loading/unloading) and polishing a plurality of substrates may be performed simultaneously. For example, while a first substrate is loaded to the carrier 13 placed on the first carrier point CP1 from the second transfer point TP2, a second substrate may be gripped by the carrier 13 placed on the second carrier point CP2 and may be polished. In addition, when the second substrate is polished, the second substrate may be moved to the first carrier point CP1 and may be unloaded to the transfer arm 112 placed on the second transfer point TP2, conversely, the first substrate may be moved to the second carrier point CP2 and may be polished. While polishing a substrate, loading (or unloading) another substrate may be simultaneously performed by way of the above-described configuration. Thus, process time may be reduced and productivity may be enhanced.

In addition, as described above, when the substrate transfer unit 11 transfers a substrate by rotation, a transfer path and time for transferring may be minimized. For example, when the first substrate which is unpolished is inserted to the first transfer point TP1 from a cassette, the first substrate may be transferred to the second transfer point TP2 and may be loaded for the primary polishing. Simultaneously, the second substrate on which the primary polishing is being done wherein the second substrate is seated on the second transfer point TP2 may be transferred to the third transfer point TP3 and may be loaded for the secondary polishing. In addition, simultaneously, a third substrate on which the secondary polishing is being done wherein the third substrate is seated on the third transfer point TP3 may be transferred to the first transfer point TP1 and may be transferred for a next process. The above-mentioned process may be simultaneously, sequentially, and continuously performed on a plurality of substrates. Thus, a production efficiency may be enhanced since a plurality of substrates may be simultaneously and continuously transferred and polished.

Figure 4:
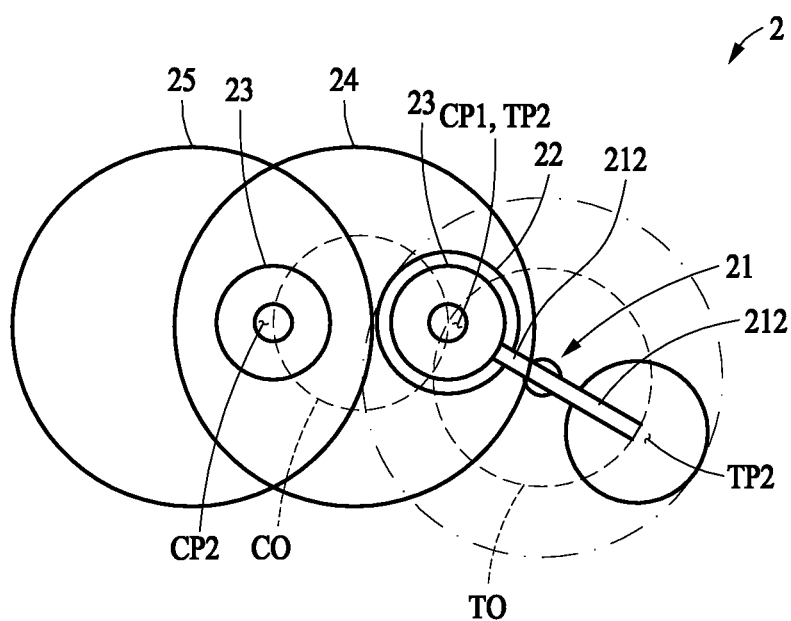
FIG. 4 is a schematic plan view of a substrate polishing system according to an example embodiment.

FIG. 4 is a schematic plan view illustrating a substrate polishing system according to an example embodiment.

Referring to FIG. 4, a substrate polishing system 2 may include a substrate transfer unit 21, a loader 22, a carrier 23, a carrier transfer unit 24 and a platen 25.

FIG. 4 illustrates a structure provided with the substrate transfer unit 21 including two transfer arms 212, two carriers 23, one carrier transfer unit 24, and one platen 25. Referring to the structure of FIG. 4, a description of a first transfer point TP1, a second transfer point TP2, a first carrier point CP1 and a second carrier point CP2 would be substantially same as the above description, thus, details thereof have been omitted.

Even in the structure of FIG. 4, while a first substrate is undergoing polishing at the second carrier point CP2, a second substrate may be loaded or unloaded at the first carrier point CP1. In addition, by rotation of the substrate transfer unit 21, an unpolished substrate placed on the first transfer point TP1 may be transferred to the second transfer point TP2 while a polished substrate placed on the second transfer point TP2 may be transferred to the first transfer point TP1.

Figure 5:
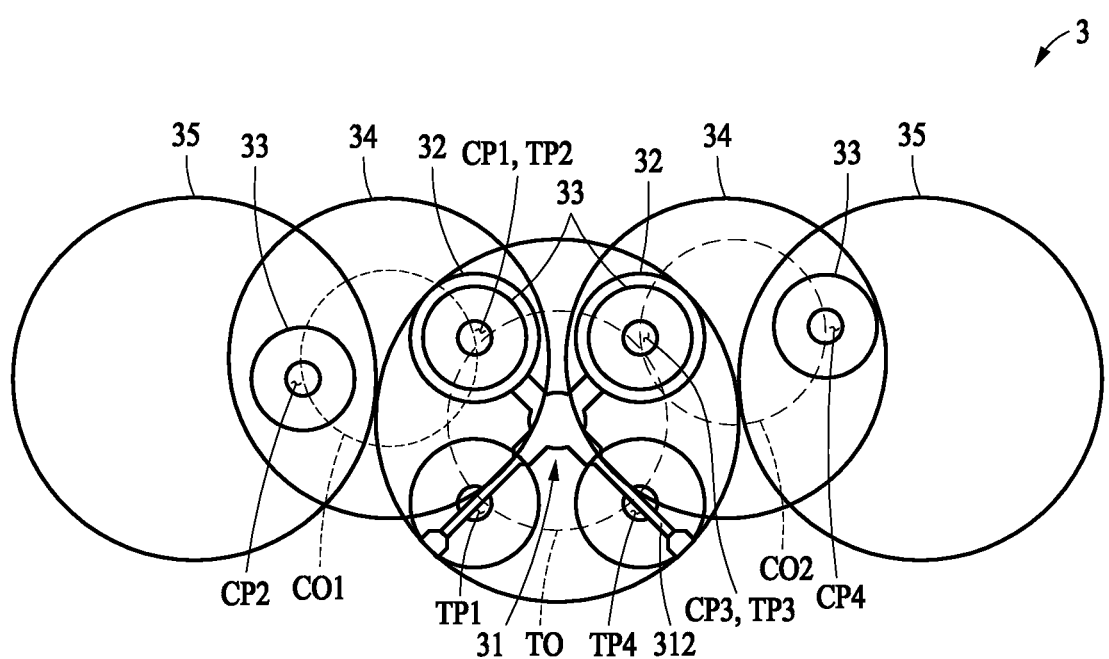
FIG. 5 is a schematic plan view of a substrate polishing system according to an example embodiment.

FIG. 5 is a schematic plan view illustrating a substrate polishing system according to an example embodiment.

Referring to FIG. 5, a substrate polishing system 3 may include a substrate transfer unit 31, a loader 32, a carrier 33, a carrier transfer unit 34 and a platen 35.

FIG. 5 illustrates a structure provided with the substrate transfer unit 31 including four transfer arms 312, four carriers 33, two carrier transfer units 34, and two platens 35. In the structure of FIG. 5, four transfer arms 312 may be placed on a first transfer point TP1, a second transfer point TP2, a third transfer point TP3, and a fourth transfer point TP4 respectively. The fourth transfer point TP4 may be a point at which an unpolished substrate is received from a return unit or a polished substrate is transferred to the return unit. A description of the carrier 33, the carrier transfer unit 34 and the platen 35 would be substantially the same as the above description, thus, details thereof have been omitted.

Even in the structure of FIG. 5, while a first substrate is undergoing polishing at the second carrier point CP2 (or the fourth carrier point CP4), a second substrate may be loaded or unloaded at the first carrier point CP1 (or the third carrier point CP3). In addition, substrates may be sequentially transferred by rotation of the substrate transfer unit 31. For example, an unpolished substrate placed on the first transfer point TP1 may be transferred to the second transfer point TP2 or the third transfer point TP3. Simultaneously, a polished substrate placed on the third transfer point TP3 or the second transfer point TP2 may be transferred to the fourth transfer point TP4.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A substrate polishing system comprising:
    a substrate transfer unit comprising a shaft to rotate on a rotation axis perpendicular to a ground and at least one transfer arm to support a bottom surface of a substrate, and transfer the substrate while forming a transfer orbit by rotation of the shaft;
    at least one carrier to perform polishing of the substrate transferred by the substrate transfer unit; and
    a carrier transfer unit to support the at least one carrier from an upper side of the at least one carrier, the carrier transfer unit to rotate on a rotation axis perpendicular to a ground in a circular orbit moving the at least one carrier in a carrier orbit, to move the at least one carrier from the substrate transfer unit for a polishing process,
    wherein:
        the at least one transfer arm comprises a first end connected to the shaft and a second end, opposite the first end, configured to support the bottom surface of the substrate, and
        the carrier orbit is above and overlapping a portion of the transfer orbit.

2. The substrate polishing system of claim 1, wherein the transfer arm receives an unpolished substrate at a first transfer point on the transfer orbit and transfers the unpolished substrate to the carrier at a second transfer point on the transfer orbit.

3. The substrate polishing system of claim 2, wherein the transfer arm receives a polished substrate from the carrier at the second transfer point and transfers the polished substrate to the first transfer point for a next process.

4. The substrate polishing system of claim 2, further comprising:
    a loader disposed at the second transfer point wherein the loader loads the substrate from the transfer arm to the carrier or unloads the substrate from the carrier to the transfer arm.

5. The substrate polishing system of claim 4, wherein in a process of loading or unloading by the loader, the substrate transfer unit is vertically movable.

6. The substrate polishing system of claim 5, wherein the loader is integrally formed with the substrate transfer unit.

7. The substrate polishing system of claim 2, wherein a plurality of transfer arms is provided and are each disposed at a predetermined interval with the shaft as center.

8. The substrate polishing system of claim 7, wherein, when one of the plurality of transfer arms is placed on the first transfer point, at least one of the plurality of transfer arms is placed on the second transfer point.

9. The substrate polishing system of claim 1, wherein the carrier receives an unpolished substrate from the transfer arm at a first carrier point on the carrier orbit and performs polishing on the unpolished substrate at a second carrier point on the carrier orbit.

10. The substrate polishing system of claim 9, wherein the carrier transfers a polished substrate from the first carrier point to the transfer arm placed on the second transfer point.

11. The substrate polishing system of claim 10, wherein the first carrier point overlaps with the second transfer point.

12. The substrate polishing system of claim 10, wherein a plurality of carriers is provided and are each disposed at a predetermined interval with the rotation axis of the carrier transfer unit as a center.

13. The substrate polishing system of claim 12, wherein, when one of the plurality of carriers is placed on the first carrier point, at least one of the plurality of carriers is placed on the second carrier point.

14. The substrate polishing system of claim 9, wherein the second carrier point overlaps with a platen on which a polishing pad is placed.

15. The substrate polishing system of claim 1, wherein the at least one carrier comprises a plurality of carriers, each of the plurality of carriers attached to the carrier transfer unit.

16. The substrate polishing system of claim 15, the plurality of carriers disposed at an equiangular interval with a rotation axis of the carrier transfer unit as center.

17. The substrate polishing system of claim 15, wherein the carrier transfer unit rotates in the circular orbit to move one of the plurality of carriers from the substrate transfer unit to a platen for the polishing process and another of the plurality of carriers, carrying a polished substrate, from the platen back to the substrate transfer unit.

* * * * *